(12) United States Patent
Farnworth et al.

(10) Patent No.: US 7,632,713 B2
(45) Date of Patent: Dec. 15, 2009

(54) METHODS OF PACKAGING MICROELECTRONIC IMAGING DEVICES

(75) Inventors: Warren M. Farnworth, Nampa, ID (US); William Mark Hiatt, Eagle, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 753 days.

(21) Appl. No.: 10/832,601

(22) Filed: Apr. 27, 2004

(65) Prior Publication Data

US 2005/0236708 A1     Oct. 27, 2005

(51) Int. Cl.
*H01L 21/00* (2006.01)

(52) U.S. Cl. .......................... 438/116; 438/64; 438/65; 438/66; 438/67; 438/68; 257/E21.001

(58) Field of Classification Search .......... 257/E21.001, 257/E23.128, E23.178; 438/64–68, 116
See application file for complete search history.

(56) References Cited

U.S. PATENT DOCUMENTS

| | | | | |
|---|---|---|---|---|
| 6,144,507 A * | 11/2000 | Hashimoto | .................. | 359/819 |
| 6,396,116 B1 * | 5/2002 | Kelly et al. | .................. | 257/432 |
| 6,492,699 B1 * | 12/2002 | Glenn et al. | ................. | 257/433 |
| 6,528,857 B1 * | 3/2003 | Glenn et al. | ................. | 257/433 |
| 6,566,745 B1 * | 5/2003 | Beyne et al. | ................. | 257/680 |
| 6,629,633 B1 * | 10/2003 | Glenn et al. | ........... | 228/180.22 |
| 6,686,588 B1 * | 2/2004 | Webster et al. | ............... | 250/239 |
| 6,765,236 B2 * | 7/2004 | Sakurai | ........................ | 257/98 |
| 6,870,208 B1 * | 3/2005 | You et al. | .................... | 257/291 |
| 6,906,405 B2 * | 6/2005 | Ono | ............................. | 257/680 |
| 6,949,808 B2 * | 9/2005 | Harazono | .................... | 257/433 |
| 6,984,866 B1 * | 1/2006 | Mostafazadeh et al. | ..... | 257/433 |
| 7,001,797 B2 * | 2/2006 | Hashimoto | ................... | 438/113 |
| 7,084,391 B1 * | 8/2006 | Chen | .......................... | 250/239 |
| 7,227,236 B1 * | 6/2007 | Lee et al. | .................... | 257/433 |
| 7,253,390 B2 * | 8/2007 | Farnworth et al. | ....... | 250/208.1 |
| 2002/0057468 A1 * | 5/2002 | Segawa et al. | .............. | 358/509 |
| 2005/0104186 A1 * | 5/2005 | Yang et al. | .................. | 257/688 |

* cited by examiner

*Primary Examiner*—Charles D. Garber
*Assistant Examiner*—Angel Roman
(74) *Attorney, Agent, or Firm*—Dickstein Shapiro LLP

(57) ABSTRACT

Microelectronic imaging devices and methods of packaging microelectronic imaging devices are disclosed herein. In one embodiment, the microelectronic imaging devices include an interposer substrate and a plurality of imager units coupled to the interposer substrate. The interposer substrate includes a plurality of openings and a plurality of contact arrays proximate to corresponding openings. The individual imager units include a microelectronic die with an image sensor and a plurality of bond-pads electrically coupled to the image sensor. The image sensors are aligned with corresponding openings on the interposer substrate, and the bond-pads are electrically coupled to corresponding contacts on the interposer substrate.

9 Claims, 9 Drawing Sheets

METHODS OF PACKAGING MICROELECTRONIC IMAGING DEVICES

TECHNICAL FIELD

The present invention is related to microelectronic devices and methods for packaging microelectronic devices. Several aspects of the present invention are directed toward microelectronic imaging devices that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending digital images. The use of microelectronic imagers in electronic devices is steadily increasing as imagers become smaller and produce higher quality images with increased pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also becoming very popular because they have low production costs, high yields, and small sizes. CMOS image sensors provide these advantages because they are manufactured using technology and equipment developed for fabricating semiconductor devices. CMOS image sensors, as well as CCD image sensors, are accordingly "packaged" to protect their delicate components and provide external electrical contacts.

FIG. 1 is a schematic side cross-sectional view of a conventional packaged microelectronic imager 1. The imager 1 includes a die 10, an interposer substrate 20 attached to the die 10, a housing 30 attached to the interposer substrate 20, and an optics unit 50 attached to the housing 30. The housing 30 has an opening 32 over the die 10 and a transparent cover 40 in the opening 32. The optics unit 50 can include a lens 54 and other optical elements' to direct light through the opening 32 and toward the die 10.

The die 10 includes an image sensor 12 and a plurality of bond-pads 14 electrically coupled to the image sensor 12. The interposer substrate 20 is a dielectric member having a plurality of interior pads 22, a plurality of ball-pads 24, and a plurality of traces 26 electrically coupling the interior pads 22 to corresponding ball-pads 24. The ball-pads 24 are arranged in an array for surface mounting the imager 1 to a board or module of another device. The bond-pads 14 on the die 10 are electrically coupled to corresponding interior pads 22 on the interposer substrate 20 by a plurality of wire-bonds 28 to provide electrical pathways between the bond-pads 14 and the ball-pads 24.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Another problem with conventional microelectronic imagers is the manufacturing costs for packaging the dies. For example, forming the wire-bonds 28 on the imager 1 shown in FIG. 1 is complex and expensive because it requires connecting an individual wire between each bond-pad 14 on the die 10 and a corresponding interior pad 22 on the interposer substrate 20. In addition, it may not be feasible to form wire-bonds for the high-density, fine-pitch arrays of some high-performance devices. Therefore, there is a significant need to enhance the efficiency and reliability of packaging microelectronic imagers.

DETAILED DESCRIPTION

A. Overview

Figure 1:
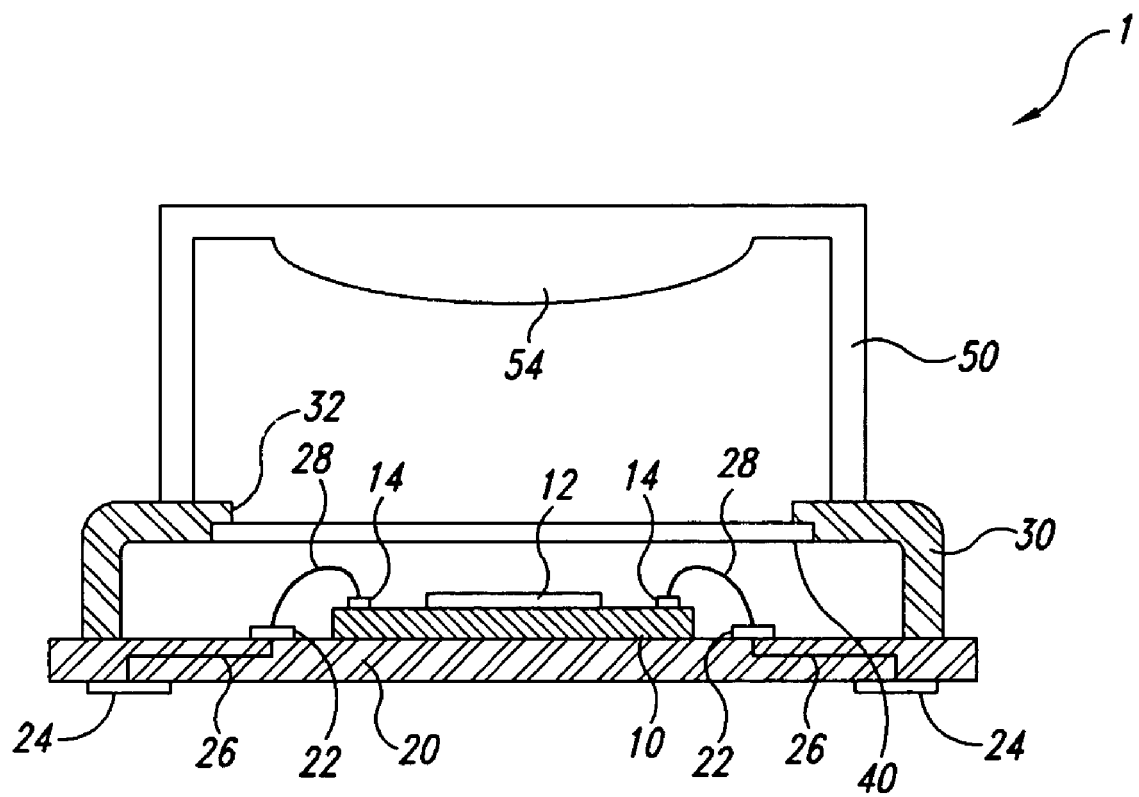
FIG. 1 is a schematic side cross-sectional view of a packaged microelectronic imager in accordance with the prior art.

The following disclosure describes several embodiments of microelectronic imaging devices and methods of packaging microelectronic imaging devices. Specific details of several embodiments of the invention are described below with reference to CMOS imagers to provide a thorough understanding of these embodiments, but other embodiments can be CCD imagers or other types of imaging devices. Several details describing well-known structures often associated with microelectronic devices are not set forth in the following description to avoid unnecessarily obscuring the description of the disclosed embodiments. Additionally, several other embodiments of the invention can have different configurations and/or components than those described in this section. As such, a person of ordinary skill in the art will accordingly understand that the invention may have other embodiments with additional elements or without several of the elements shown and described below with reference to FIGS. 2A-7.

Several aspects of the invention are directed to microelectronic imaging devices. In one embodiment, the microelectronic imaging devices include an interposer substrate and a plurality of imager units coupled to the interposer substrate.

The interposer substrate includes a plurality of openings and a plurality of contact arrays proximate to corresponding openings. The individual imager units include a microelectronic die with an image sensor and a plurality of bond-pads electrically coupled to the image sensor. The image sensors are aligned with corresponding openings on the interposer substrate, and the bond-pads are electrically coupled to corresponding contacts on the interposer substrate. In one aspect of this embodiment, the individual imager units can further include a spacer attached to the microelectronic die between the image sensor and the bond-pads and a cover attached to the spacer. The spacer is positioned so that the spacer is outboard the image sensor and the bond-pads are outboard the spacer.

In another embodiment, the microelectronic imaging devices include an interposer substrate and a plurality of imager units coupled to the interposer substrate. The interposer substrate includes a first side, a second side opposite the first side, and a plurality of contact arrays on the second side. The individual imager units include a microelectronic die with a first side, a second side opposite the first side, an image sensor on the first side, and a plurality of bond-pads on the first side electrically coupled to the image sensor. The bond-pads are coupled to corresponding contacts on the interposer substrate, and the first side of the dies faces the second side of the interposer substrate. In one aspect of this embodiment, the interposer substrate includes a plurality of openings and the microelectronic imaging devices further include a plurality of optics units coupled to corresponding imager units. The individual optics units are aligned with corresponding openings and include optic members over the corresponding image sensors. The individual imager and/or optics units can be at least partially within the corresponding openings.

Another aspect of the invention is directed to microelectronic imagers. In one embodiment, a microelectronic imager includes a microelectronic die having an integrated circuit, an image sensor electrically coupled to the integrated circuit, and a plurality of bond-pads electrically coupled to the integrated circuit. The imager further includes a spacer coupled to the die around the image sensor and a cover attached to the spacer. The spacer is between the image sensor and the bond-pads such that the spacer is outboard the image sensor and the bond-pads are outboard the spacer.

Another aspect of the invention is directed to methods of packaging imagers. In one embodiment, a method includes providing an interposer substrate having a plurality of openings and a plurality of contact arrays proximate to corresponding openings. The method further includes forming a plurality of imagers with the individual imagers having a microelectronic die with an image sensor and a plurality of bond-pads electrically coupled to the image sensor. The method further includes attaching the imagers to the interposer substrate with the image sensors aligned with corresponding openings and the bond-pads electrically coupled to corresponding contacts.

B. Embodiments of Microelectronic Imagers

Figure 2A:
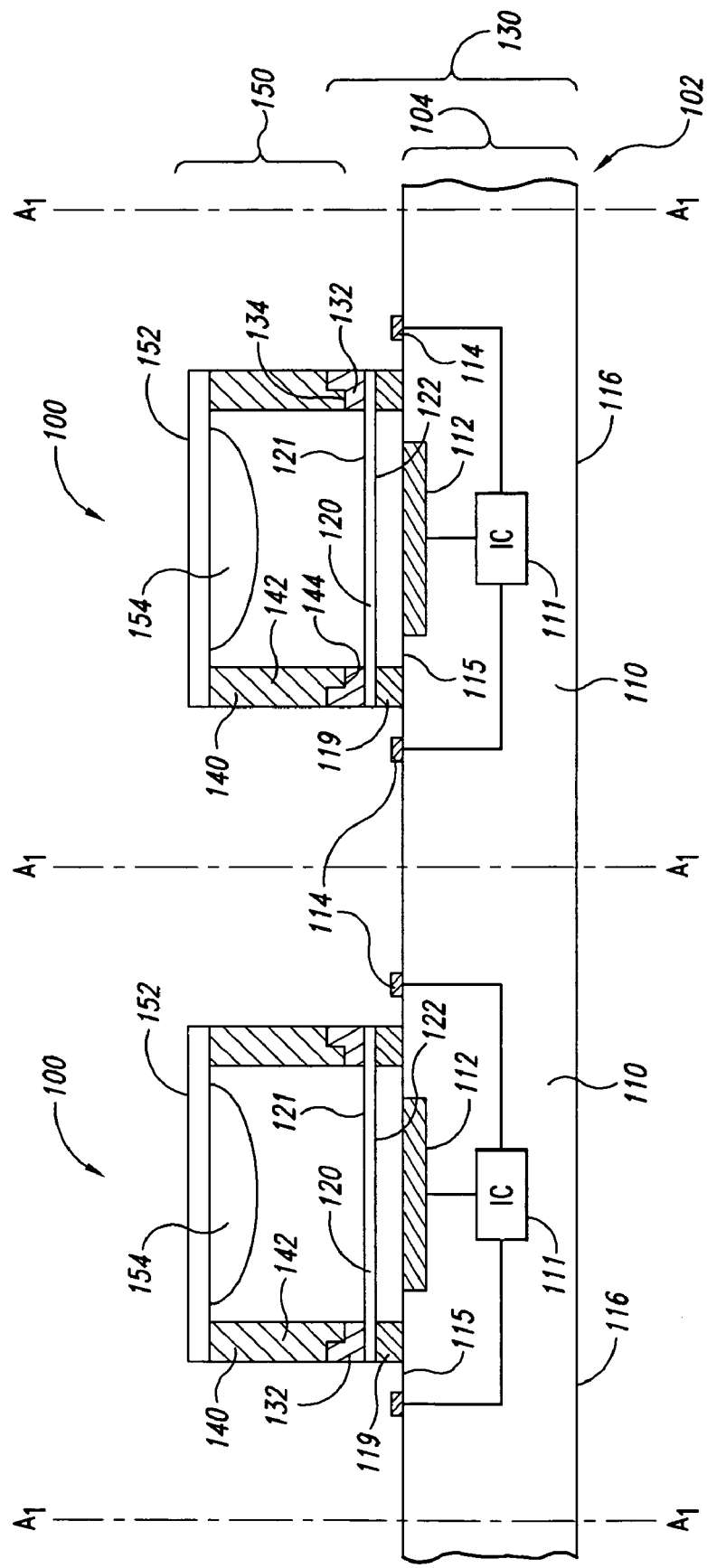
FIG. 2A is a schematic side cross-sectional view of a plurality of microelectronic imagers formed on a microfeature workpiece in accordance with one embodiment of the invention.

FIG. 2A is a schematic side cross-sectional view of a plurality of microelectronic imagers 100 formed on a microfeature workpiece 102 in accordance with one embodiment of the invention. The microfeature workpiece 102 includes a substrate 104 and a plurality of dies 110 formed in and/or on the substrate 104. In the illustrated embodiment, the individual dies 110 include a first side 115, a second side 116 opposite the first side 115, and an integrated circuit 111 (shown schematically) in the substrate 104. The individual dies 110 further include an image sensor 112 operably coupled to the integrated circuit 111 and an array of bond-pads 114 electrically coupled to the integrated circuit 111. The image sensors 112 can be CMOS devices or CCDs for capturing pictures or other images in the visible spectrum. In other embodiments, the image sensors 112 can detect radiation in other spectrums (e.g., IR or UV ranges).

Figure 2B:
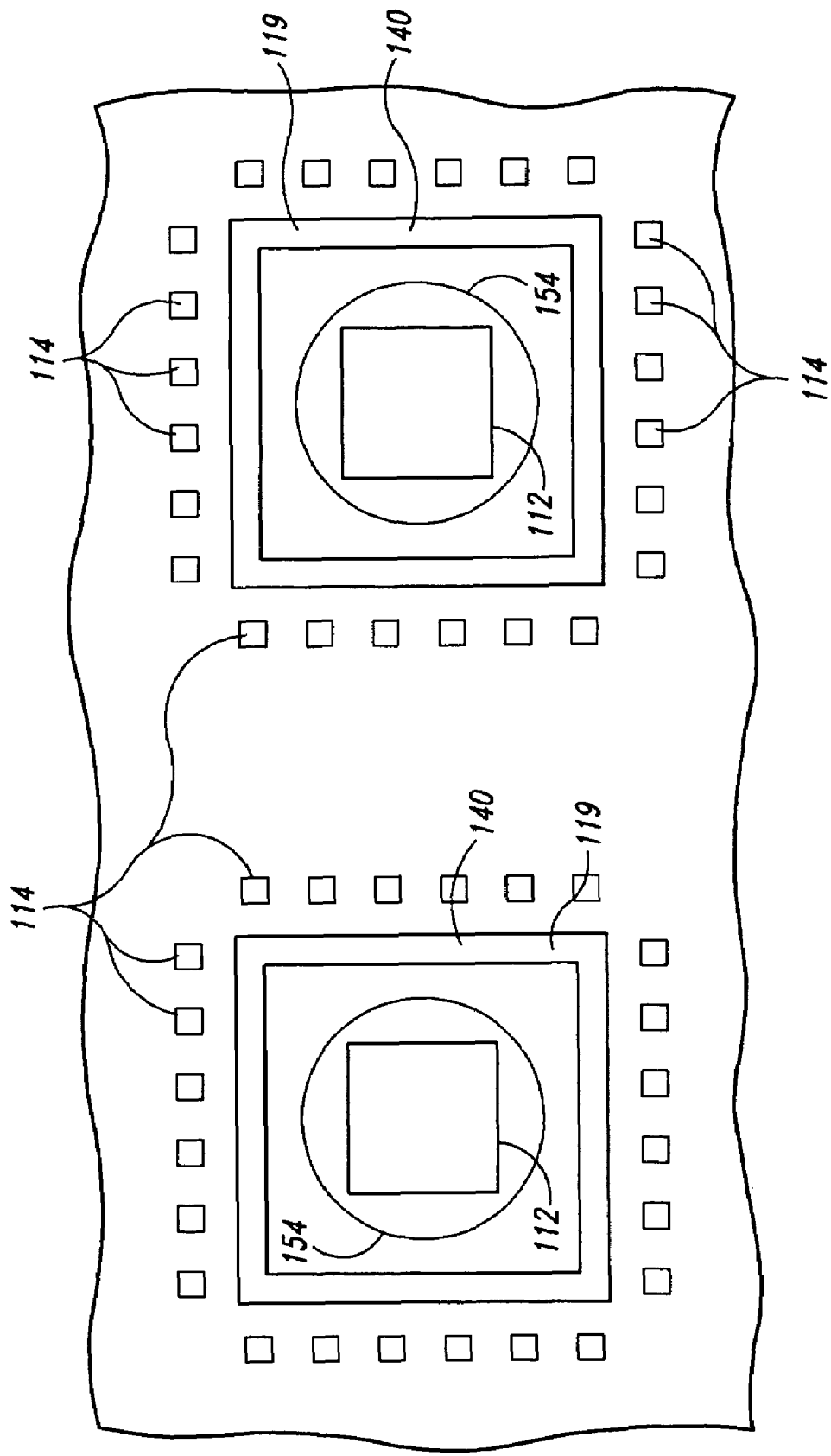
FIG. 2B is a schematic top plan view of the microelectronic imagers of FIG. 2A.

The individual microelectronic imagers 100 can further include a spacer 119 circumscribing the image sensor 112 and a cover 120 mounted to the spacer 119 to form an enclosure for protecting the image sensor 112. The spacers 119 are attached to the first side 115 of corresponding dies 110 between the array of bond-pads 114 and the image sensor 112. Accordingly, as illustrated in FIG. 2B, which is a schematic top plan view of the microelectronic imagers 100 of FIG. 2A, individual spacers 119 are positioned outboard a corresponding image sensor 112, and corresponding bond-pads 114 are positioned outboard an individual spacer 119.

Referring back to FIG. 2A, the individual covers 120 are attached to corresponding spacers 119 with a first side 121 facing away from the image sensor 112 and a second side 122 facing generally toward the image sensor 112. As such, the covers 120 and the spacers 119 enclose and protect the image sensors 112 while the bond-pads 114 are exposed for attachment to contacts of a redistribution substrate(s) or other external device(s). The covers 120 can be glass, quartz, or other materials transmissive to a desired spectrum of radiation. In embodiments directed toward imaging radiation in the visible spectrum, the covers 120 can also filter infrared radiation or other undesirable spectrums of radiation. The covers 120, for example, can be formed from a material and/or have a film stack or other coating that filters IR or near IR spectrums. In the illustrated individual microelectronic imagers 100, the die 110, the spacer 119, and the cover 120 define an imager unit 130.

In the illustrated embodiment, the individual imager units 130 can further include a first referencing element 132 attached to the first side 121 of the cover 120 at a fixed position relative to the image sensor 112. The first referencing elements 132 have a first interface feature 134 configured to receive a complementary referencing element of an optics unit in a fixed, preset position to accurately situate a lens or other optic member at a desired location with respect to the image sensor 112. In this embodiment, the first referencing elements 132 are first stand-off sections defined by a raised feature projecting from the respective cover 120, but in other embodiments, the first referencing elements can be other types of supports. Alternatively, other microelectronic imagers may not include first referencing elements.

The individual microelectronic imagers 100 can further include an optics unit 150 attached to the imager unit 130 to transmit the desired spectrum of radiation to the image sensor 112. The illustrated optics units 150 can include a substrate 152, an optic member 154 on the substrate 152, and a second referencing element 142 attached to the substrate 152. The substrates 152 can be glass or quartz, and the substrates 152 can be coated to filter infrared radiation from the visible light spectrum. The optic members 154 can be a lens for focusing the light, a pinhole for reducing higher order refractions, and/or another optical structure for performing other functions. The second referencing elements 142 include a second interface feature 144 configured to mate or otherwise interface with the first interface feature 134 of a corresponding first referencing element 132. The first and second referencing elements 132 and 142 of the individual microelectronic imagers 100 define a support member 140 that carries and positions the optics unit 150 at a desired location relative to the image sensor 112.

In additional embodiments, the first and second referencing elements 132 and 142 can have interface features with other complementary configurations, such as those described in U.S. patent application Ser. No. 10/723,363, entitled "Packaged Microelectronic Imagers and Methods of Packaging Microelectronic Imagers," filed on Nov. 26, 2003, which is incorporated by reference herein. Alternatively, the first and second referencing elements 132 and 142 can be a single unitary member to carry the substrate 152 and the optic member 154. In other embodiments, the microelectronic imagers 100 may not include separate optics units 150. For example, the optic member can be attached to the cover, or the optic member can be formed in and/or on the cover.

The illustrated microelectronic imagers 100 can be formed according to the processes disclosed in U.S. patent application Ser. No. 10/863,994, entitled "Wafer-Level Packaged Microelectronic Imagers And Processes For Wafer-Level Packaging," filed on Jun. 9, 2004, which is incorporated by reference herein, and U.S. patent application Ser. No. 10/894,262, entitled "Microelectronic Imagers With Optical Devices And Methods Of Manufacturing Such Microelectronic Imagers," filed on Jul. 19, 2004, which is incorporated by reference herein. After the microelectronic imagers 100 are formed on the microfeature workpiece 102, the imagers 100 can be tested to determine which imagers function properly. The workpiece 102 can then be cut along lines $A_1$-$A_1$ to singulate individual imagers 100, and defective microelectronic imagers can be discarded. In other embodiments, the individual imagers are probed (e.g., tested) after being singulated in addition to or in lieu of being tested at the wafer level.

C. Embodiments of Interposer Substrates

Figure 3A:
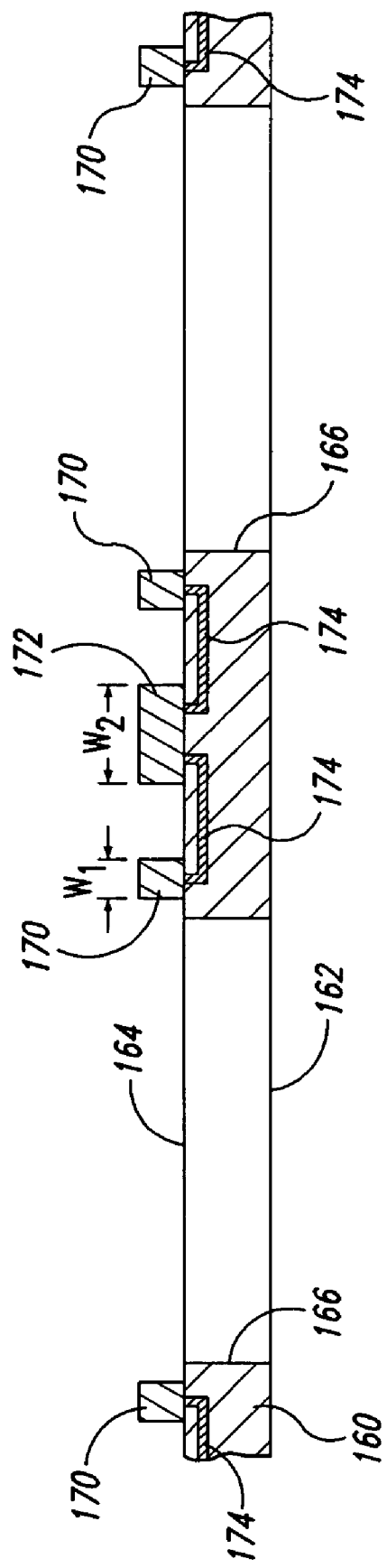
FIG. 3A is a schematic side cross-sectional view of an interposer substrate for use with microelectronic imagers in accordance with one embodiment of the invention.
Figure 3B:
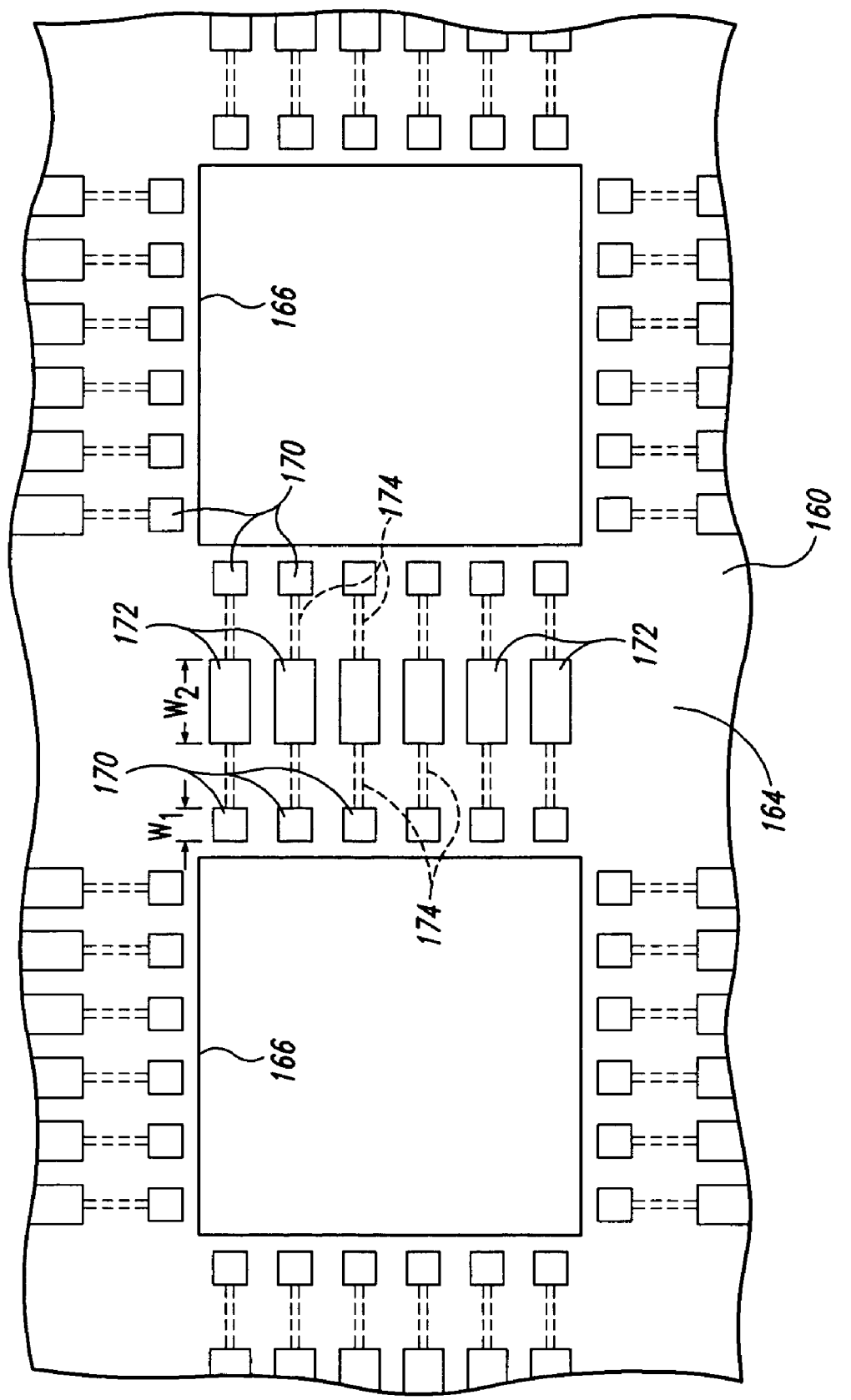
FIG. 3B is a schematic top plan view of the interposer substrate of FIG. 3A.

FIG. 3A is a schematic side cross-sectional view and FIG. 3B is a schematic top plan view of an interposer substrate 160 for use with microelectronic imagers in accordance with one embodiment of the invention. The interposer substrate 160 includes a first side 162 (FIG. 3A), a second side 164 opposite the first side 162, and a plurality of openings 166 extending through the substrate 160 from the first side 162 to the second side 164. The individual openings 166 can be sized and configured to receive a portion of a corresponding microelectronic imager when the imager is attached to the interposer substrate 160.

The interposer substrate 160 can be a printed circuit board, flex tape, semiconductor wafer, or other suitable substrate in and/or on which conductive lines are formed to conduct electrical signals from microelectronic imagers to external devices. For example, the illustrated interposer substrate 160 includes a plurality of interior contacts 170, a plurality of exterior contacts 172 (only one shown in FIG. 3A), and a plurality of conductive lines 174 electrically connecting the interior contacts 170 to corresponding exterior contacts 172. As best shown in FIG. 3B, the interior contacts 170 can be arranged in arrays around corresponding openings 166 so that the contacts 170 in each array are aligned with and electrically coupled to corresponding bond-pads of a microelectronic imager when the imager is attached to the interposer substrate 160. The exterior contacts 172 are spaced apart from corresponding interior contacts 170 and are arranged in arrays for coupling to corresponding external devices. The exterior contacts 172 redistribute the small, fine-pitch array of the interior contacts 170 to provide a larger array that can be coupled to exterior devices more easily. As such, the interposer substrate 160 redistributes electrical signals from the bond-pads of microelectronic imagers to the terminals of corresponding external devices.

In the embodiment shown in FIG. 3A, the interior and exterior contacts 170 and 172 project from the second side 164 of the interposer substrate 160, and the conductive lines 174 are formed in the substrate 160. In other embodiments, such as those described below with reference to FIGS. 5 and 6, the contacts may not project from the second side of the substrate and/or the conductive lines may not be embedded in the substrate 160. Moreover, in the illustrated embodiment, the interior contacts 170 have a width $W_1$ and the exterior contacts 172 have a width $W_2$ greater than the width $W_1$. As such, the exterior contacts 172 can be electrically connected to two interior contacts 170 positioned at adjacent openings 166. In subsequent processing, the individual exterior contacts 172 can be cut into a first portion that is electrically coupled to one interior contact 170 and a second portion that is electrically coupled to the other interior contact 170 of an adjacent device. In other embodiments, individual exterior contacts 172 can each be coupled to a single interior contact 170.

The interior and exterior contacts 170 and 172 can be formed by stenciling, electroplating, electroless plating, or other suitable processes to place discrete volumes of an electrically conductive material in and/or on the interposer substrate 160. The conductive material can be a flowable conductive material, such as solder, or another suitable conductive material to provide terminals to which the microelectronic imagers can be electrically connected. The conductive material can also be a conductive adhesive to physically bond the microelectronic imagers to the interposer substrate 160 while electrically connecting the imagers to the substrate 160.

D. Embodiments of Microelectronic Imaging Devices

Figure 4:
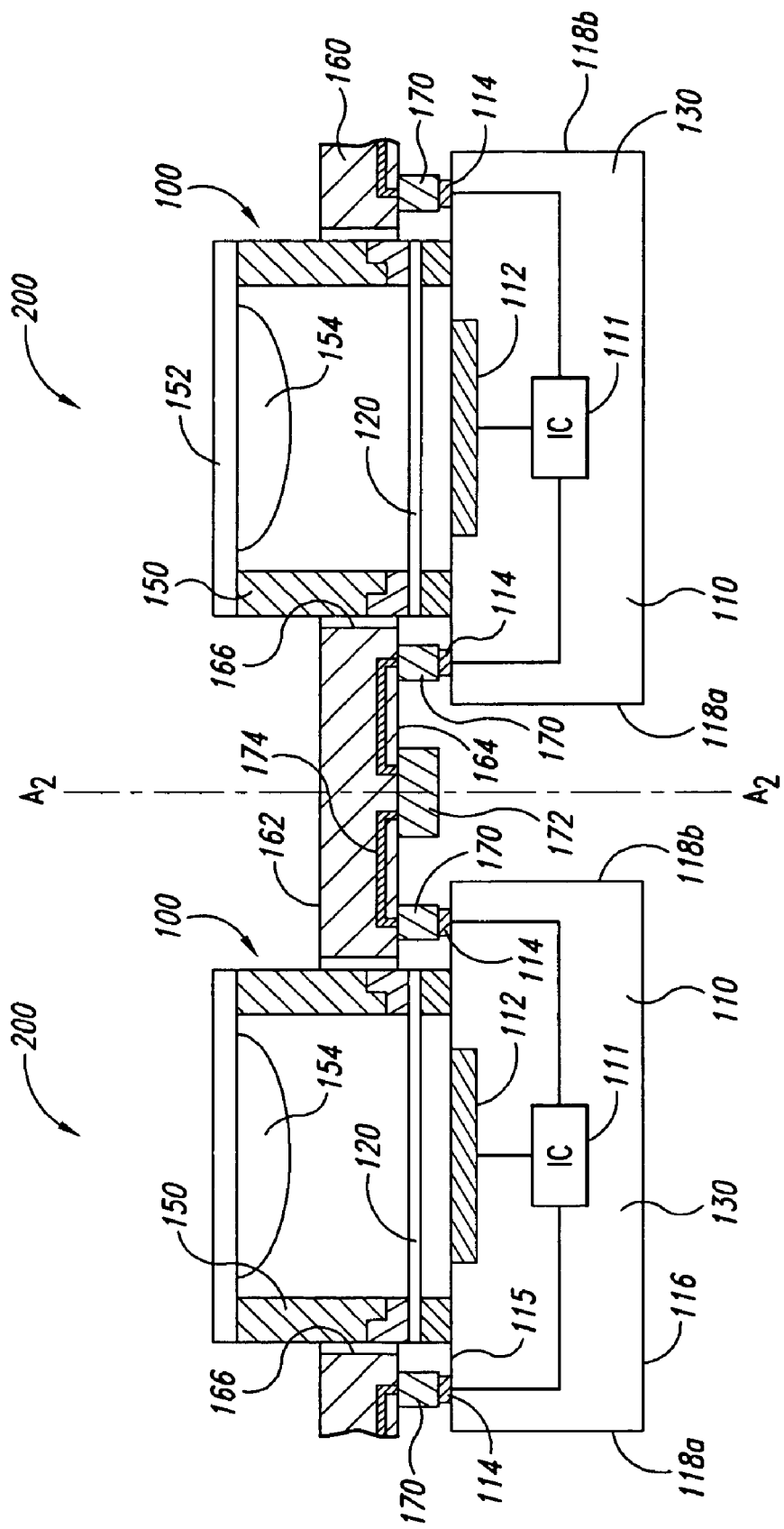
FIG. 4 is a schematic side cross-sectional view of a plurality of microelectronic imaging devices formed by attaching the microelectronic imagers of FIGS. 2A-2B to the interposer substrate of FIGS. 3A-3B.

FIG. 4 is a schematic side cross-sectional view of a plurality of microelectronic imaging devices 200 formed by attaching the microelectronic imagers 100 to the interposer substrate 160. The microelectronic imagers 100 are attached to the interposer substrate 160 by positioning the optics units 150 within corresponding openings 166 with the first side 115 of the dies 110 facing toward the second side 164 of the substrate 160. The microelectronic imagers 100 are also oriented so that individual bond-pads 114 on the dies 110 are aligned with corresponding interior contacts 170 on the interposer substrate 160. After the microelectronic imagers 100 are properly positioned, the interposer substrate 160 and the imagers 100 can pass through the reflow process to securely join the bond-pads 114 to the interior contacts 170. In other embodiments, such as the embodiment described below with reference to FIG. 6, the imagers can be securely attached to the interposer substrate by other devices. In either case, the exterior contacts 172 of the interposer substrate 160 are electrically coupled to corresponding bond-pads 114 on the dies 110 via the respective conductive lines 174 and interior contacts 170. After attachment, the interposer substrate 160 can be cut along line $A_2$-$A_2$ to singulate individual microelectronic imaging devices 200.

One feature of the illustrated embodiment is that several microelectronic imaging devices 200 can be simultaneously tested before singulation to determine which devices 200 function properly. For example, a testing device can contact the exterior contacts 172 of the interposer substrate 160 to simultaneously test all or at least many of the microelectronic imaging devices 200. Defective microelectronic imaging devices can be segregated and either discarded or salvaged after singulation. An advantage of this feature is that it is more efficient in terms of cost and time to jointly test the microelectronic imaging devices 200 than to test each device 200 individually. Another advantage is that known good imagers can be salvaged from defective substrates or connections.

Another advantage of the embodiment illustrated in FIG. 4 is that positioning a portion of the microelectronic imagers 100 in the corresponding openings 166 of the interposer substrate 160 reduces the vertical profile or height of the microelectronic imaging devices 200. More specifically, the vertical profile of the individual imaging devices 200 is the distance between the top of the optics unit 150 and the bottom of the die 110. In prior art devices, such as the device illustrated in FIG. 1, the vertical profile of the devices is the distance between the top of the optics unit 50 and the bottom of the interposer substrate 20, which is attached to the back side of the die 10. Thus, the microelectronic imaging devices 200 illustrated in FIG. 4 have lower vertical profiles than conventional devices by at least the thickness of the substrate 20 (FIG. 1).

Another feature of the illustrated embodiment is that the electrical connections between the microelectronic imagers 100 and the interposer substrate 160 are directly above the corresponding dies 110. More specifically, the interior contacts 170, which electrically connect the dies 110 to the interposer substrate 160, are positioned between a first end 118a and a second end 118b of the corresponding dies 110. An advantage of this feature is that the footprint of each microelectronic imaging device 200 is smaller than the conventional device shown in FIG. 1 because the required surface area on the interposer substrate 160 is reduced by connecting the die 110 to the substrate 160 directly over the die 110. The reduced footprint of the individual microelectronic imaging devices 200 is particularly advantageous for picture cell phones, PDAs, or other applications where space is limited. In prior art devices, such as the device illustrated in FIG. 1, the bond-pads 14 are wire-bonded to the interior pads 22 outboard the die 10, which increases the footprint of the interposer substrate 20.

E. Additional Embodiments of Microelectronic Imaging Devices

Figure 5:
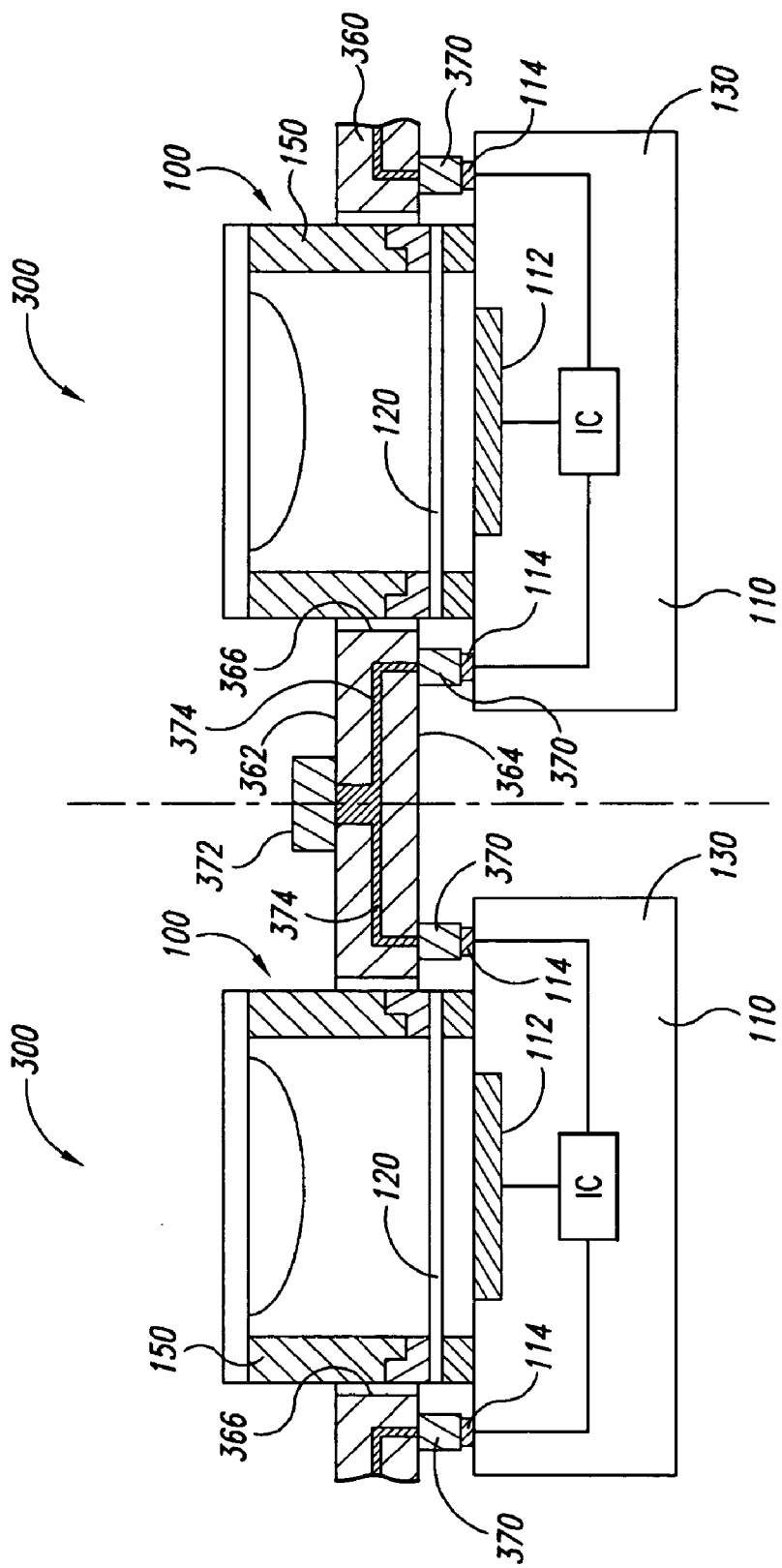
FIG. 5 is a schematic side cross-sectional view of a plurality of microelectronic imaging devices in accordance with another embodiment of the invention.

FIG. 5 is a schematic side cross-sectional view of a plurality of microelectronic imaging devices 300 in accordance with another embodiment of the invention. The individual microelectronic imaging devices 300 include a microelectronic imager 100 attached to an interposer substrate 360. The illustrated interposer substrate 360 includes a first side 362, a second side 364 opposite the first side 362, and a plurality of openings 366 sized to receive a portion of a corresponding microelectronic imager 100. The illustrated interposer substrate 360 further includes a plurality of interior contacts 370 projecting from the second side 364, a plurality of exterior contacts 372 (only one shown) projecting from the first side 362, and a plurality of conductive lines 374 electrically connecting the interior contacts 370 to corresponding exterior contacts 372. Because the exterior contacts 372 project from the first side 362 of the interposer substrate 360, the microelectronic imaging devices 300 can be mounted face down on external devices.

Figure 6:
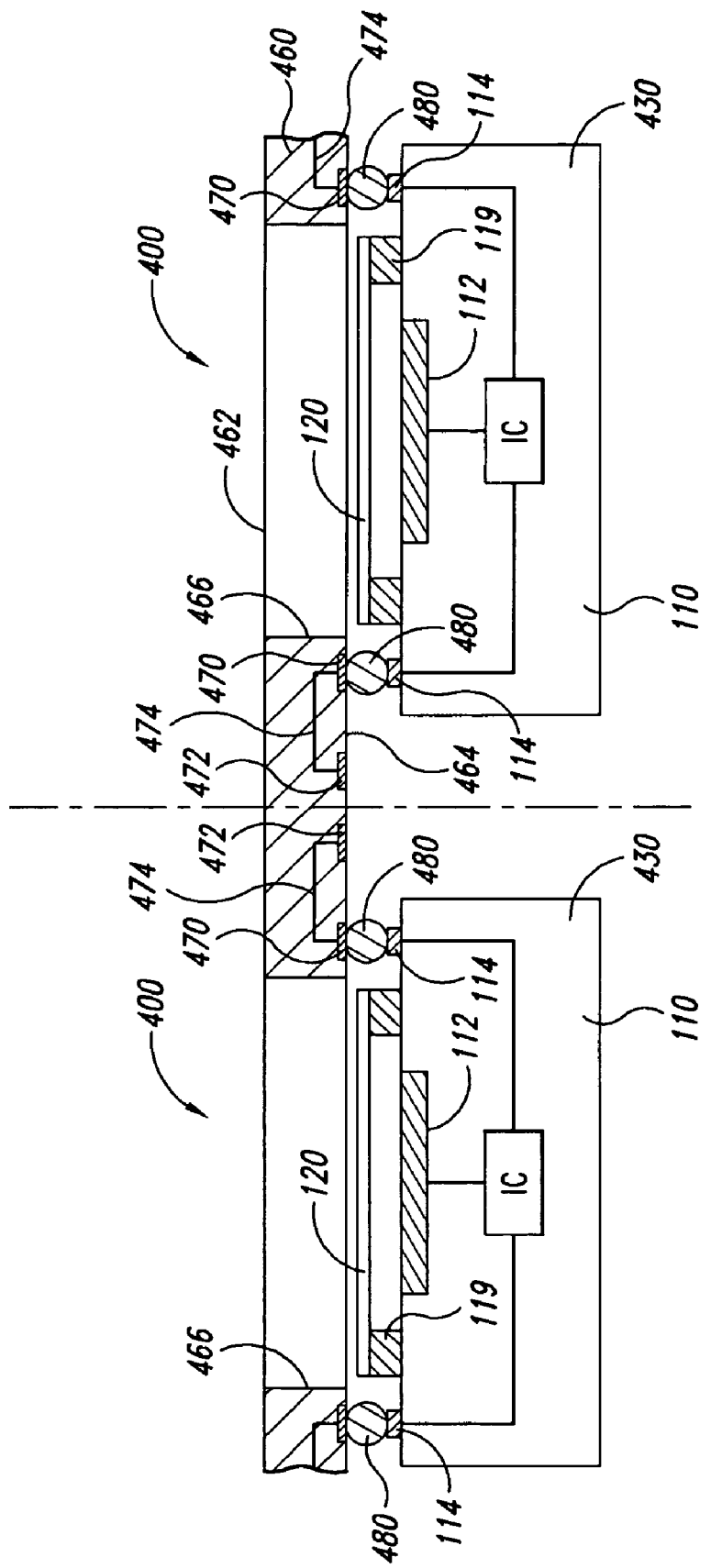
FIG. 6 is a schematic side cross-sectional view of a plurality of microelectronic imaging devices in accordance with another embodiment of the invention.

FIG. 6 is a schematic side cross-sectional view of a plurality of microelectronic imaging devices 400 in accordance with another embodiment of the invention. The individual microelectronic imaging devices 400 include an imager unit 430 attached to an interposer substrate 460. The imager units 430 can be generally similar to the imager units 130 described above with reference to FIGS. 2A-2B, except the imager units 430 do not include a first referencing element. The interposer substrate 460 includes a first side 462, a second side 464 opposite the first side 462, and a plurality of openings 466 extending from the first side 462 to the second side 464. The illustrated interposer substrate 460 further includes a plurality of interior contacts 470, a plurality of exterior contacts 472, and a plurality of conductive lines 474 electrically coupling the interior contacts 470 to corresponding exterior contacts 472. The interior and exterior contacts 470 and 472 can be formed in and/or on the second side 464 of the interposer substrate 460. For example, the interior and exterior contacts 470 and 472 can be pads sized and configured to contact corresponding electrical couplers 480. Additionally, as mentioned above, the exterior contacts 472 are individually connected to a single interior contact 470 even before cutting the substrate 460 to singulate the imaging devices 400. The electrical couplers 480 physically and electrically connect the interior contacts 470 to corresponding bond-pads 114 on the dies 110. In additional embodiments, the individual microelectronic imaging devices 400 can include an optics unit attached to the imager unit 430.

F. Additional Embodiments of Microelectronic Imagers

Figure 7:
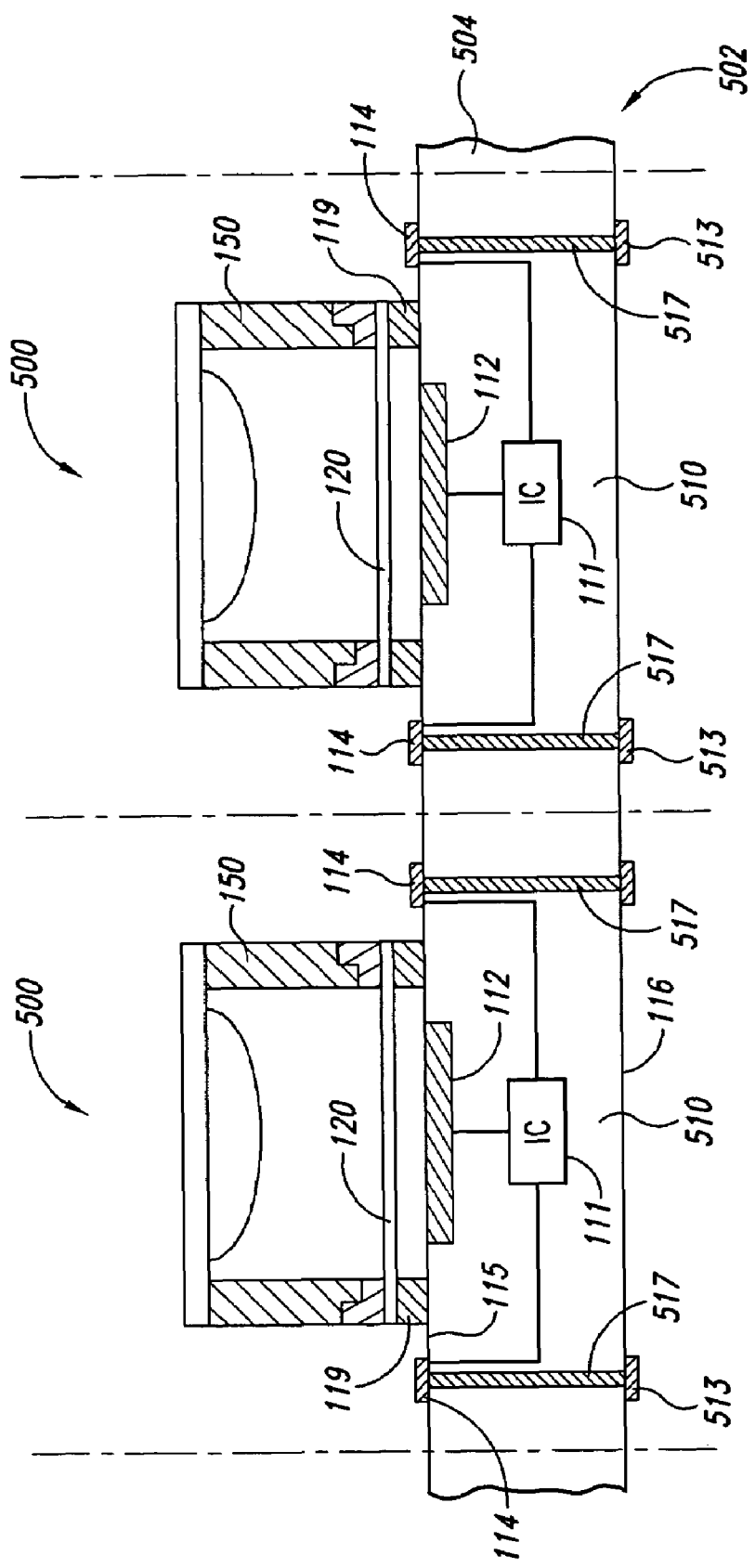
FIG. 7 is a schematic side cross-sectional view of a plurality of microelectronic imagers formed on a microfeature workpiece in accordance with another embodiment of the invention.

FIG. 7 is a schematic side cross-sectional view of a plurality of microelectronic imagers 500 formed on a microfeature workpiece 502 in accordance with another embodiment of the invention. The microfeature workpiece 502 includes a substrate 504 and a plurality of microelectronic dies 510 formed in and/or on the substrate 504. The illustrated dies 510 are generally similar to the dies 110 described above with reference to FIGS. 2A-2B. However, unlike the dies 110 described above, the illustrated dies 510 further include a plurality of ball-pads 513 and a plurality of conductive interconnects 517 coupled to corresponding ball-pads 513. The ball-pads 513 are formed in and/or on the second side 116 of the dies 510 and are configured to receive corresponding electrical couplers such as solder balls. The conductive interconnects 517 extend from the first side 115 to the second side 116 of the dies 510 and contact corresponding bond-pads 114. The conductive interconnects 517 can be formed according to the processes disclosed in U.S. patent application Ser. No. 10/713,878, entitled "Microelectronic Devices, Methods for Forming Vias in Microelectronic Devices, and Methods for Packaging Microelectronic Devices," filed on Nov. 13, 2003, which is incorporated by reference herein. The microelectronic imagers 500 can be subsequently singulated and attached to interposer substrates such as those described above with reference to FIGS. 3A-6.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A method of packaging a plurality of imagers, comprising:

providing an interposer substrate, wherein the interposer substrate has a plurality of openings through the substrate, a plurality of interior contact arrays positioned proximate to corresponding openings, and a plurality of exterior contacts positioned between adjacent interior contact arrays, each exterior contact being electrically connected to a plurality of interior contacts;

providing a plurality of imagers with the individual imagers including a microelectronic die having an image sensor, an optics unit positioned to transmit a particular spectrum of radiation to the image sensor, and a plurality of bond-pads electrically coupled to the image sensor; and attaching the imagers to the interposer substrate with the image sensors aligned with corresponding openings, the optics units positioned at least partially within the corresponding opening, and the bond-pads electrically coupled to corresponding interior contacts.

2. The method of claim 1 wherein:

the interposer substrate further includes a first side and a second side opposite the first side, with the interior contact arrays on the second side;

the individual microelectronic dies further include a first side and a second side opposite the first side, with the image sensor and bond-pads on the first side; and attaching the imagers to the interposer substrate comprises coupling the imagers to the substrate with the first side of the microelectronic dies facing toward the second side of the interposer substrate.

3. The method of claim 1 wherein providing the imagers further comprises:

attaching a plurality of spacers to corresponding microelectronic dies between the image sensor and the bond-pads so that individual spacers are outboard corresponding image sensors and the corresponding bond-pads are outboard the individual spacers; and attaching a plurality of covers to corresponding spacers.

4. The method of claim 1 wherein:

the microelectronic dies further include a first end and a second end opposite the first end; and attaching the imagers to the interposer substrate comprises attaching the imagers to the substrate so that the interior contacts are positioned between the first and second ends of the corresponding microelectronic die.

5. The method of claim 1 wherein attaching the imagers to the interposer substrate comprises electrically coupling the bond-pads to corresponding interior contacts without wire-bonds.

6. The method of claim 1 wherein:

attaching the imagers to the interposer substrate comprises coupling the bond-pads directly to the corresponding interior contacts; and the method further comprises reflowing the contacts to bond the interior contacts to the corresponding bond-pads.

7. A method of packaging a plurality of imagers, comprising:

providing an interposer substrate, wherein the interposer substrate has a plurality of openings through the substrate, a plurality of interior contact arrays positioned proximate to corresponding openings, and a plurality of exterior contacts positioned between adjacent interior contact arrays, each exterior contact being electrically connected to at least one interior contact, wherein the interior contacts and exterior contacts are on a same side of the interposer substrate;

providing a plurality of imagers with the individual imagers including a microelectronic die having an image sensor, an optics unit positioned in alignment with the image sensor, and a plurality of bond-pads electrically coupled to the image sensor; and attaching the imagers to the interposer substrate with the image sensors aligned with corresponding openings, the optics units positioned at least partially within the corresponding opening, and the bond-pads electrically coupled to corresponding interior contacts.

8. The method of claim 1 wherein:

the interposer substrate further includes a first side and a second side opposite the first side, with the interior contact arrays on the second side and with the exterior contacts on the first side;

the individual microelectronic dies further include a first side and a second side opposite the first side, with the image sensor and bond-pads on the first side; and attaching the imagers to the interposer substrate comprises coupling the imagers to the substrate with the first side of the microelectronic dies facing toward the second side of the interposer substrate.

9. The method of claim 7 wherein:

the interposer substrate further includes a first side and a second side opposite the first side, with the interior contact arrays and the external contacts on the second side;

the individual microelectronic dies further include a first side and a second side opposite the first side, with the image sensor and bond-pads on the first side; and attaching the imagers to the interposer substrate comprises coupling the imagers to the substrate with the first side of the microelectronic dies facing toward the second side of the interposer substrate.

* * * * *

UNITED STATES PATENT AND TRADEMARK OFFICE
CERTIFICATE OF CORRECTION

PATENT NO. : 7,632,713 B2 Page 1 of 1
APPLICATION NO. : 10/832601
DATED : December 15, 2009
INVENTOR(S) : Farnworth et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1378 days.

Signed and Sealed this

Second Day of November, 2010

David J. Kappos
*Director of the United States Patent and Trademark Office*